United States Patent
Lee et al.

(10) Patent No.: US 9,614,181 B2
(45) Date of Patent: Apr. 4, 2017

(54) ORGANIC LIGHT EMITTING DISPLAY APPARATUS AND METHOD OF MANUFACTURING THE SAME

(71) Applicant: Samsung Display Co., Ltd., Yongin (KR)

(72) Inventors: Ung-Soo Lee, Yongin (KR); Jae-Sun Lee, Yongin (KR); Hun Kim, Yongin (KR); Jai-Hyuk Choi, Yongin (KR); Su-Hyuk Choi, Yongin (TW); Jin-Woo Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/195,416

(22) Filed: Mar. 3, 2014

(65) Prior Publication Data
US 2015/0014653 A1    Jan. 15, 2015

(30) Foreign Application Priority Data
Jul. 12, 2013    (KR) .................. 10-2013-0082441

(51) Int. Cl.
*H01L 51/52*    (2006.01)

(52) U.S. Cl.
CPC ...... *H01L 51/5253* (2013.01); *H01L 2251/55* (2013.01); *H01L 2251/556* (2013.01)

(58) Field of Classification Search
CPC .................................. H01L 51/5237–51/5259
See application file for complete search history.

(56) References Cited

U.S. PATENT DOCUMENTS

| | | | | |
|---|---|---|---|---|
| 5,281,560 A | * | 1/1994 | Francis | ............. C03C 8/24 501/15 |
| 2008/0048178 A1 | * | 2/2008 | Aitken | ............. C23C 14/06 257/40 |
| 2008/0080019 A1 | | 4/2008 | Hayashi et al. | |
| 2008/0146431 A1 | * | 6/2008 | Aitken | ............. C03C 8/24 501/44 |
| 2009/0324830 A1 | | 12/2009 | Aitken et al. | |

(Continued)

FOREIGN PATENT DOCUMENTS

KR    10-2006-0113989    11/2006
KR    10-2008-0018817    2/2008
KR    10-2008-0080019    9/2008

*Primary Examiner* — Cuong Q Nguyen
*Assistant Examiner* — Nishath Yasmeen
(74) *Attorney, Agent, or Firm* — H.C. Park & Associates, PLC

(57) ABSTRACT

Provided is an organic light emitting display apparatus. The apparatus may include a substrate including a display region where an image is realized and a non-display region surrounding the display region. The apparatus includes an organic light emitting unit including a first electrode, an intermediate layer, and a second electrode, which are disposed in the display region and are sequentially stacked on the substrate. The apparatus also includes a first inorganic film including a first low temperature viscosity transition (LVT) inorganic material having a first viscosity transition temperature, and covering the organic light emitting unit; and a second inorganic film including a second LVT inorganic material having a second viscosity transition temperature lower than the first viscosity transition temperature, and formed in the non-display region.

9 Claims, 5 Drawing Sheets

(56) References Cited

U.S. PATENT DOCUMENTS

2011/0020587 A1   1/2011  Aitken et al.
2011/0025196 A1*  2/2011  Rakuff ................ H01L 51/5237
                                                             313/504
2012/0091477 A1*  4/2012  Kim .................... H01L 51/5246
                                                             257/88

* cited by examiner

ORGANIC LIGHT EMITTING DISPLAY APPARATUS AND METHOD OF MANUFACTURING THE SAME

CROSS-REFERENCE TO RELATED APPLICATION

This application claims the benefit of Korean Patent Application No. 10-2013-0082441, filed on Jul. 12, 2013, which is hereby incorporated by reference for all purposes as if fully set forth herein.

BACKGROUND

Field

Exemplary embodiments of the present invention relate to an organic light emitting display apparatus and a method of manufacturing the same.

Description of the Background

An organic light emitting display apparatus is a self-emissive type device, and not only providing a wide viewing angle and excellent contrast, but also having characteristic such as a quick response time, excellent luminance, an excellent driving voltage, and an excellent response speed. Further, the organic light emitting display apparatus is capable of realizing multiple colors.

The organic light emitting display apparatus may include an organic light emitting unit including a lower electrode, an organic layer, and an upper electrode. Since the organic light emitting unit is very vulnerable to an external environment, such as oxygen and moisture, an encapsulation structure for encapsulating the organic light emitting unit from the external environment is utilized.

At the same time, the organic light emitting display apparatus needs to be thinned and/or flexible.

SUMMARY OF THE INVENTION

Exemplary embodiments of the present invention provide an organic light emitting display apparatus having a strong and thin film encapsulation structure, and a method of manufacturing the same.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose an organic light emitting display. The display includes a substrate including a display region and a non-display region outside the display region. The display includes an organic light emitting unit disposed in the display region. The organic light emitting unit includes a first electrode, an intermediate layer, and a second electrode that are disposed in the display region and are sequentially stacked on the substrate. The display includes a first inorganic film including a first low temperature viscosity transition (LVT) inorganic material. The first LVT inorganic material includes a first viscosity transition temperature. The first inorganic film covers the organic light emitting unit. The display also includes a second inorganic film including a second LVT inorganic material. The second LVT inorganic material includes a second viscosity transition temperature lower than the first viscosity transition temperature. The second inorganic film is formed on the non-display region.

Exemplary embodiments of the present invention disclose method of manufacturing an organic light emitting display. The method includes forming an organic light emitting unit by sequentially stacking a first electrode, an intermediate layer, and a second electrode on a display region of a substrate. The method includes forming a first inorganic film covering the organic light emitting unit, the first inorganic film including a first low temperature viscosity transition (LVT) inorganic material including a first viscosity transition temperature. The method also includes forming a second inorganic film on a non-display region of the substrate, the second inorganic film including a second LVT inorganic material including a second viscosity transition temperature lower than the first viscosity transition temperature.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
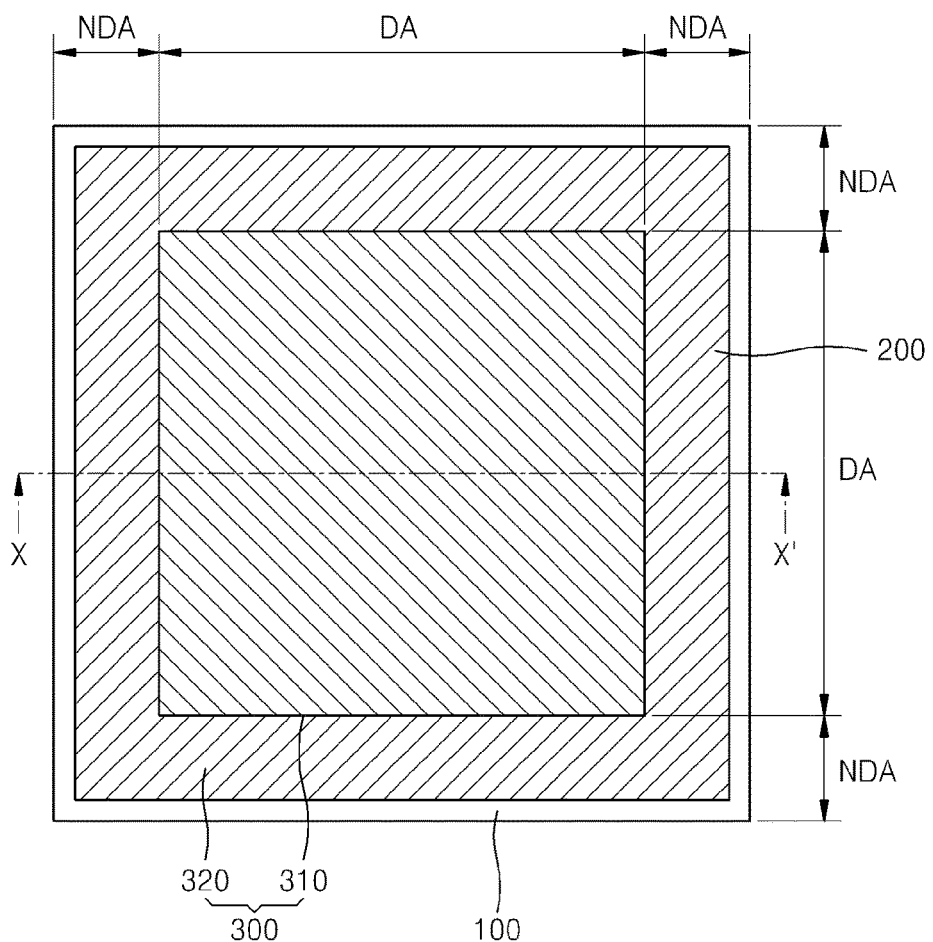
FIG. 1 is a plan view schematically illustrating an organic light emitting display apparatus according to exemplary embodiments of the present invention.

An organic light emitting display apparatus and method of manufacturing the same are disclosed. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

For clear understanding of one or more embodiments of the present invention, unrelated elements are not illustrated or described, or simply illustrated or described. Also, thicknesses and areas of layers and regions may be exaggerated for clarity in drawings.

Also in the drawings, like reference numerals denote like elements. The terms "first," "second," and the like do not have limited meanings, and are used to distinguish one element from another. It will also be understood that when a portion, such as a layer, a region, or an element, is referred to as being "on" another portion, it can be directly on the other portion, or intervening portions may also be present.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
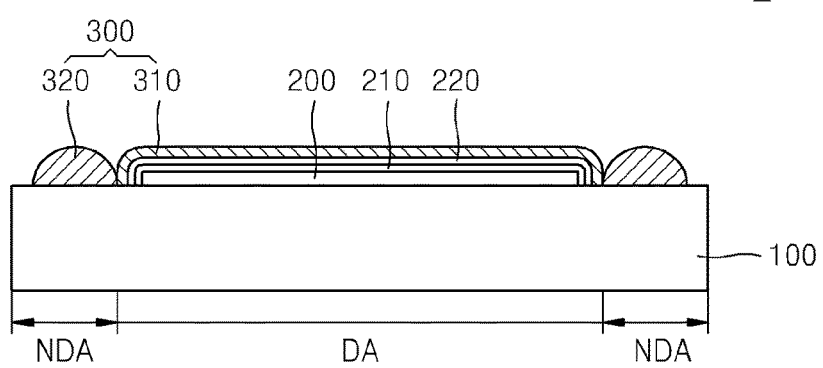
FIG. 2 is a cross-sectional view taken along a line X-X' of FIG. 1.

FIG. 1 is a plan view schematically illustrating an organic light emitting display apparatus 1 according to exemplary embodiments of the present invention, and FIG. 2 is a cross-sectional view taken along a line X-X' of FIG. 1.

Referring to FIGS. 1 and 2, the organic light emitting display apparatus 1 may include a substrate 100, an organic light emitting unit 200, and an encapsulation unit 300 covering the organic light emitting unit 200.

The substrate 100 may be divided into a display region (DA) where an image is realized, and a non-display region (NDA) surrounding the display region (DA).

The organic light emitting unit 200 where an image is realized is disposed on the display region (DA).

The organic light emitting unit 200 may include a first electrode (not shown), an intermediate layer (not shown), and a second electrode (not shown), which may be sequentially stacked on the substrate 100.

A power supply wiring unit (not shown), a driver integrated circuit (IC) (not shown) may be disposed on the non-display region (NDA) outside the display region (DA).

For example, a first inorganic film 310 may be formed on the display region (DA) of the substrate 100 to cover the organic light emitting unit 200. Also, a second inorganic film 320 may be formed to cover the non-display region (NDA) of the substrate 100.

The first inorganic film 310 and the second inorganic film 320 may be inorganic films having different viscosity transition temperatures, and the first inorganic film 310 having high transmissivity despite of a high viscosity transition temperature may be formed on the display region (DA) and the second inorganic film 320 having a low viscosity transition temperature despite of low transmissivity may be formed on the non-display region (NDA).

The second inorganic film 320 may be formed while contacting the first inorganic film 310, but exemplary embodiments of the present invention are not limited thereto. For example, the second inorganic film 320 may be formed to cover a predetermined region of the first inorganic film 310.

The non-display region (NDA) is a region where an image is not realized, and does not affect operations of the organic light emitting display apparatus 1 despite of low transmissivity. Accordingly, by forming the second inorganic film 320 having a low viscosity transition temperature compared to the first inorganic film 310, a sealing effect of the second inorganic film 320 may be increased, and thus degeneration of the organic light emitting unit 200 caused by external moisture transmission, such as oxygen or moisture, from a side portion of the organic light emitting display apparatus 1 may be prevented.

The first inorganic film 310 and the second inorganic film 320 may include a low temperature viscosity transition (LVT) inorganic material.

Herein, the term "viscosity transition temperature" does not mean a temperature at which viscosity of the LVT inorganic material completely changes from "solid" to "liquid", but means a minimum temperature for providing fluidity to the LVT inorganic material.

A first LVT inorganic material included in the first inorganic film 310 formed to cover the organic light emitting unit 200 may have a first viscosity transition temperature equal to or higher than 200° C.

The first LVT inorganic material may include tin oxide (SnO) and at least one of phosphorous oxide ($P_2O_5$), boron phosphate ($BPO_4$), tin fluoride ($SnF_2$), niobium oxide (NbO or $Nb_2O_5$), lead fluoride ($PbF_2$), silicon oxide ($SiO_2$), tungsten oxide ($WO_3$), indium oxide ($In_2O_3$), bismuth oxide ($Bi_2O_3$), zinc oxide (ZnO), and boron oxide ($B_2O_3$).

For example, the first LVT inorganic material may include:

SnO and $P_2O_5$;

SnO, $P_2O_5$, and $B_2O_3$;

SnO, $P_2O_5$, and $SnF_2$; or

SnO, $P_2O_5$, $B_2O_3$, and $SnF_2$, but is not limited thereto.

For example, the first LVT inorganic material may have a following composition, but a material and a composition of the first LVT inorganic material are not limited as long as the first LVT inorganic material has the first viscosity transition temperature equal to or higher than 200° C.

1) SnO (60 to 80 mol %) and $P_2O_5$ (20 to 40 mol %);

2) SnO (60 to 80 mol %), $P_2O_5$ (10 to 20 mol %), and $B_2O_3$ (10 to 20 mol %) (here, the sum of SnO, $P_2O_5$, and $B_2O_3$ is 100 mol %);

3) SnO (40 to 60 mol %), $P_2O_5$ (20 to 40 mol %), and $SnF_2$ (1 to 19 mol %) (here, the sum of SnO, $P_2O_5$, and $SnF_2$ is 100 mol %); or 4) SnO (40 to 60 mol %), $P_2O_5$ (10 to 20 mol %), $B_2O_3$ (10 to 20 mol %), and $SnF_2$ (1 to 19 mol %) (here, the sum of SnO, $P_2O_5$, $B_2O_3$, and $SnF_2$ is 100 mol %).

While forming the first inorganic film 310, a first heating operation is performed to prevent a defect caused by moisture or oxygen.

The first heating operation is performed at a temperature equal to or higher than the first viscosity transition temperature of the first LVT inorganic material. For example, the first heating operation may be performed by thermally treating a first pre-inorganic film formed on the display region (DA) so as to form the first inorganic film 310 at a temperature equal to or higher than the first viscosity transition temperature and lower than a degeneration temperature of a material included in the organic light emitting unit 200.

By performing the first heating operation, the first LVT inorganic material included in the first pre-inorganic film may be fluidized. The fluidized first LVT inorganic material may have flowability. Accordingly, during the first heating operation, the fluidized first LVT inorganic material may flow and filled in a pin hole of the first pre-inorganic film.

As a result, a defect of the first pre-inorganic film is removed, and thus the first inorganic film 310 having a dense film quality may be formed.

A thickness of the first inorganic film 310 may be from about 1 µm to about 30 µm, for example, from about 1 µm to about 5 µm. Here, when the thickness of the first inorganic film 310 is within the range from about 1 µm to about 5 µm, a flexible organic light emitting apparatus having a bending characteristic may be realized.

A second LVT inorganic material included in the second inorganic film 320 formed to cover the non-display region (NDA) has a second viscosity transition temperature lower than 120° C. For example, the second viscosity transition temperature of the second LVT inorganic material may be equal to or higher than 80°, for example, from 80° C. to 120° C., but is not limited thereto.

In some examples, the second LVT inorganic material may be one type of compound or a mixture of two or more types of compounds.

The second LVT inorganic material may include tin oxide, such as SnO or $SnO_2$.

When the second LVT inorganic material includes SnO, an amount of SnO may be from about 20 wt % to about 100 wt %.

For example, the second LVT inorganic material may include, as well as tin oxide, at least one of phosphorous oxide ($P_2O_5$), boron phosphate ($BPO_4$), tin fluoride ($SnF_2$), niobium oxide (NbO or $Nb_2O_5$), lead fluoride ($PbF_2$), silicon oxide ($SiO_2$), tungsten oxide ($WO_3$), indium oxide ($In_2O_3$), bismuth oxide ($Bi_2O_3$), zinc oxide (ZnO), and boron oxide ($B_2O_3$).

For example, the second LVT inorganic material may include:

SnO;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$, but is not limited thereto.

For example, the second LVT inorganic material may have a following composition, but a material and a composition of the second LVT inorganic material are not limited as long as the second LVT inorganic material has the second viscosity transition temperature lower than 120° C.

1) SnO (100 mol %);
2) SnO (90 mol %) and $BPO_4$ (10 mol %);
3) SnO (32.5 to 42.5 mol %), $SnF_2$ (35 to 50 mol %), and $P_2O_5$ (15 to 20 mol %) (here, the sum of SnO, $SnF_2$, and $P_2O_5$ is 100 mol %);
4) SnO (20 to 50 mol %), $SnF_2$ (30 to 60 mol %), $P_2O_5$ (10 to 30 mol %), and NbO (1 to 5 mol %) (here, the sum of SnO, $SnF_2$, $P_2O_5$, and NbO is 100 mol %); or
5) SnO (20 to 50 mol %), $SnF_2$ (30 to 60 mol %), $P_2O_5$ (10 to 30 mol %), and $WO_3$ (1 to 5 mol %) (here, the sum of SnO, $SnF_2$, $P_2O_5$, and $WO_3$ is 100 mol %).

The second inorganic film 320 may include a defect, such as a film formation element or a pin hole, and such a defect may operate as a moving passage of an external environmental material, such as moisture or oxygen, while storing and operating the organic light emitting display apparatus 1, thereby causing a progressive dark spot. Accordingly, a life of the organic light emitting display apparatus 1 may be decreased.

Thus, a second heating operation for removing such a defect is performed while forming the second inorganic film 320.

The second heating operation is performed at a temperature equal to or higher than the second viscosity transition temperature of the second LVT inorganic material. For example, the second heating operation may be performed by thermally treating a second pre-inorganic film formed on the non-display region (NDA) so as to form the second inorganic film 320 at a temperature equal to or higher than the second viscosity transition temperature of the second LVT inorganic material and lower than the degeneration temperature of the material included in the organic light emitting unit 200.

For example, the second heating operation may be performed by thermally treating the second pre-inorganic film formed on the non-display region (NDA) for 1 to 3 hours at a temperature from 120° C. to 150° C. (for example, for 2 hours at 130° C.), but is not limited thereto. When the temperature of the second heating operation is within a range described above, the second LVT inorganic material of the second pre-inorganic film may be fluidized, and thus an edge defect of the organic light emitting display apparatus 1 may be prevented.

In order to prevent the organic light emitting unit 200 from being exposed to an external environment, the second heating operation may be performed in an infrared ray (IR) oven under a vacuum or inert gas ($N_2$ or Ar) atmosphere.

By performing the second heating operation, the second LVT inorganic material included in the second pre-inorganic film may be fluidized. The fluidized second LVT inorganic material may have flowability. Accordingly, during the second heating operation, the fluidized second LVT inorganic material may flow and filled in a pin hole of the second pre-inorganic film, and the film formation element may be fluidized and filed in the pin hole.

As a result, a defect of the second pre-inorganic film may be removed, and thus the second inorganic film 320 having a dense film quality may be formed.

A thickness of the second inorganic film 320 may be from about 1 µm to about 30 µm, for example, from about 1 µm to about 5 µm. Here, when the thickness of the second inorganic film 320 is within a range from about 1 µm to about 5 µm, a flexible organic light emitting apparatus having a bending characteristic may be realized.

Since the second inorganic film 320 may be a thin film as described above, the second inorganic film 320 may contribute in realizing a flexible organic light emitting apparatus having a bending characteristic. Accordingly, an organic light emitting apparatus having a long life and a bending characteristic may be realized.

According to exemplary embodiments of the present invention, a defect, such as a dark spot, generated near an edge of the organic light emitting display apparatus 1 may be prevented by forming the first inorganic film 310 and the second inorganic film 320 having different viscosity transition temperatures respectively on the display region (DA) and the non-display region (NDA).

An organic film 210 may be further formed on the second electrode 200c of the organic light emitting unit 200. The organic film 210 operates as a protection layer for preventing the second electrode 200c from being damaged while forming the first inorganic film 310 via thin film encapsulation on the organic light emitting unit 200.

When the organic light emitting unit 200 is a top emission type where light is emitted towards the second electrode 200c, the organic film 210 is formed of a material that is transparent and has a high refractive index so as to perform refractive index matching. The organic film 210 may be formed of at least one of lithium fluoride (LiF), 8-hydroxy-quinolinolato-lithium (Liq), and tris(8-hydroxy-quinolate) aluminum ($Alq_3$). The organic film 210 may be also formed on the substrate 100, as well as a top surface of the organic light emitting unit 200. The organic film 210 may be a uniform film so as to seal the entire organic light emitting unit 200.

Also, in order to promote adhesion between the organic film 210 and the first inorganic film 310, an adhesion promoting film 220 may be further disposed between the first inorganic film 310 and the organic film 210. The adhesion promoting film 220 may include at least one of a metal oxide and an organometallic compound.

Figure 3:
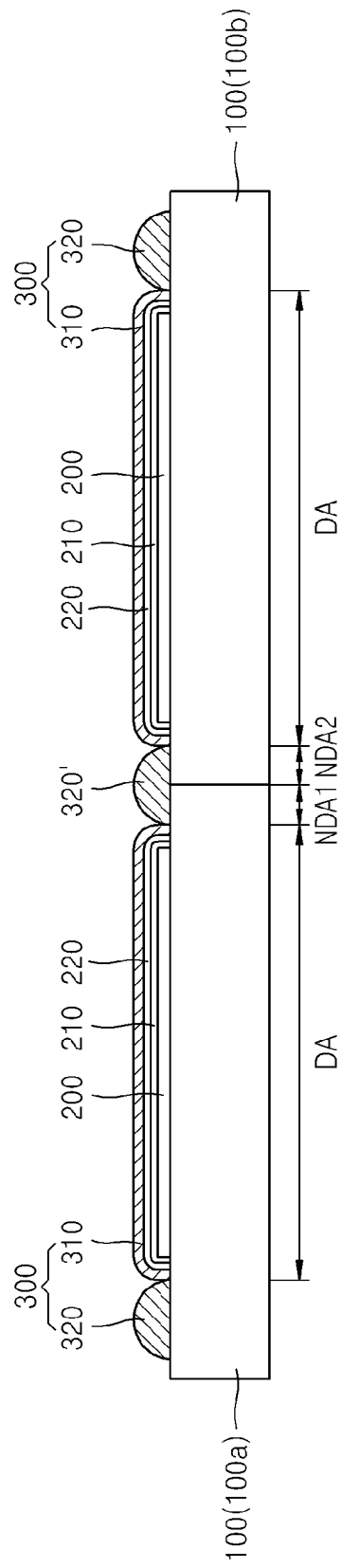
FIG. 3 is a plan view schematically illustrating an organic light emitting display apparatus according to exemplary embodiments of the present invention.

FIG. 3 is a plan view schematically illustrating an organic light emitting display apparatus according to exemplary embodiments of the present invention. Since components of FIG. 3 corresponding to those of FIG. 1 perform the same or similar functions as those of FIG. 1, details thereof are not repeated here.

When the non-display region (NDA) of FIG. 3 does not have enough space to form the second inorganic film 320, a second inorganic film 320' is formed throughout a non-display region (NDA1) of a first substrate 100a and a non-display region (NDA2) of a second substrate 100b.

After forming the second inorganic film 320' on the non-display regions (NDA1 and NDA2), a cutting operation may be performed on the second inorganic film 320' and the substrate 100 in order to obtain a plurality of organic light emitting display apparatuses. FIGS. 4 through 7 are views for describing a method of manufacturing an organic light emitting display apparatus, according to exemplary embodiments of the present invention.

Figure 4:
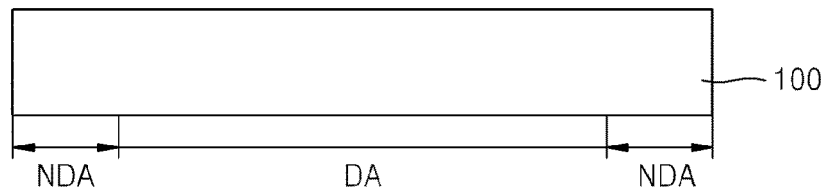
FIGS. 4, 5, 6 and 7 are views for describing a method of manufacturing an organic light emitting display apparatus, according to exemplary embodiments of the present invention.

Referring to FIG. 4, first, the substrate 100 is prepared. The substrate 100 may be a substrate generally used in an organic light emitting display apparatus. The substrate 100 may be formed of a material having excellent mechanical strength, excellent thermal stability, excellent surface flatness, excellent handling easiness, and excellent waterproofing.

The substrate 100 may be formed of a rigid material, such as glass, plastic, metal, or carbon fiber. Alternatively, when an organic light emitting display apparatus is flexible, the substrate 100 may be formed of a flexible material, such as polyimide (PI) or polyethylene terephthalate (PET).

Figure 5:
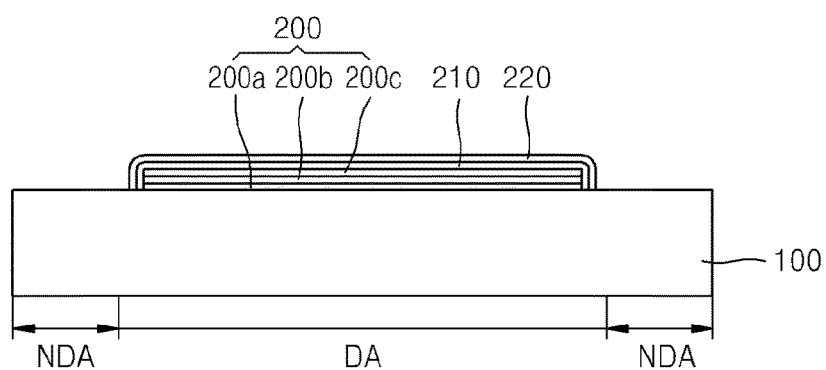

Referring to FIG. 5, the organic light emitting unit 200 is formed on the substrate 100. The organic light emitting unit 200 may have a structure in which the first electrode 200a, the intermediate layer 200b, and the second electrode 200c are sequentially stacked from the substrate 100.

The first electrode 200a may be formed by providing a first electrode material on the substrate 100 via a deposition method or a sputtering method. When the first electrode 200a is an anode, a lower electrode material may be a material having a high work function for easy hole injection. The first electrode 200a may be a reflective electrode, a semi-reflective electrode, or a transmissive electrode according to a type of an organic light emitting display apparatus. The first electrode material may be indium tin oxide (ITO), indium zinc oxide (IZO), tin oxide ($SnO_2$), or zinc oxide (ZnO), which is transparent and has excellent conductivity. Alternatively, the first electrode 200a may be a reflective electrode when magnesium (Mg), aluminum (Al), aluminum-lithium (Al—Li), calcium (Ca), magnesium-indium (Mg—In), or magnesium silver (Mg—Ag) is used.

The first electrode 200a may have a single layer structure of a multilayer structure of two or more layers. For example, the first electrode 200a may have a three layer structure of ITO/Ag/ITO in order to obtain a top emission type apparatus, but is not limited thereto.

The intermediate layer 200b may be formed on the first electrode 200a.

The intermediate layer 200b may include at least one of a hole injection layer (HIL), a hole transport layer (HTL), a functional layer simultaneously operating as a HIL and a HTL, a buffer layer, an electron blocking layer, an emission layer, a hole blocking layer, an electron transport layer (ETL), and an electron injection layer (EIL).

For example, the intermediate layer 200b may include at least one of Compound 301, Compound 311, and Compound 321 below.

[Formula 1]

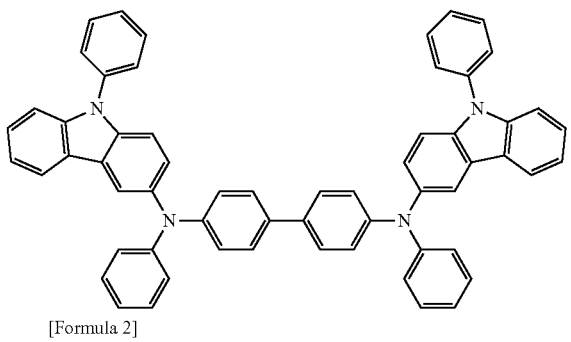

301

[Formula 2]

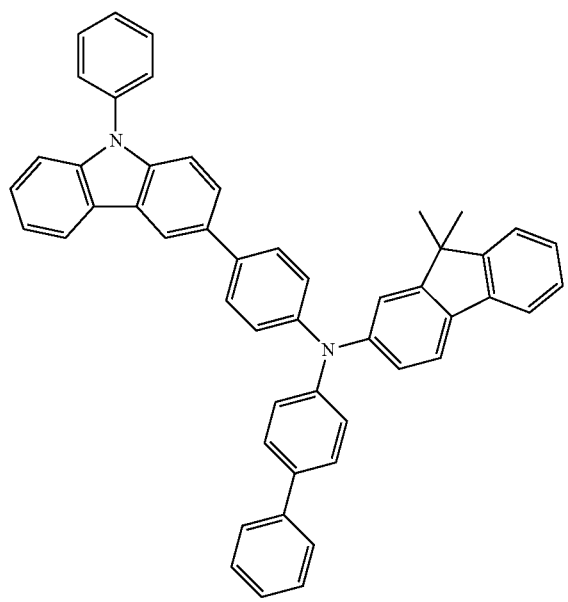

311

[Formula 3]

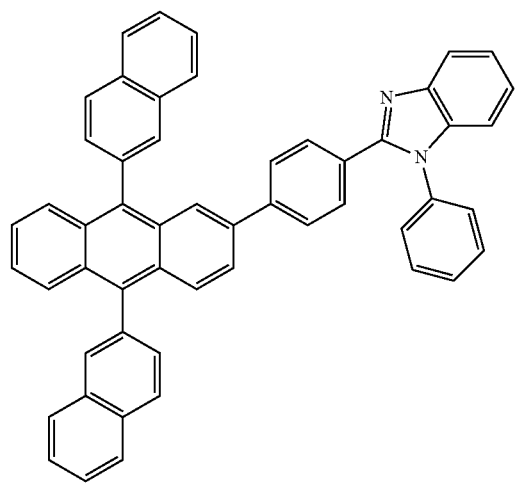

321

The second electrode 200c may be disposed on the intermediate layer 200b. The second electrode 200c may be a cathode that is an electron injection electrode, and at this time, the second electrode 200c may be formed of a metal, an alloy, an electric conductive compound, or a mixture thereof, which has a low work function. For example, a reflective, semi-reflective, or transmissive electrode may be obtained by forming a thin film by using Li, Mg, Al, Al—Li, Ca, Mg—In, or Mg—Ag. However, the second electrode 200c may be variously modified, for example, a transmissive electrode formed of ITO or IZO may be formed in order to obtain a top emission type apparatus.

Although not shown in FIG. 5, the organic light emitting unit 200 may include one pixel circuit per pixel, and the pixel circuit may include at least one thin film transistor (not shown) and a capacitor (not shown). The first electrode 200a may be operated by being electrically connected to the at least one thin film transistor.

The first electrode 200a may be patterned according to pixels, and the second electrode 200c may be a common electrode covering all pixels.

In a bottom emission type device where an image is realized towards the substrate 100, the thickness of the second electrode 200c may be relatively thick in order to increase a light emitting efficiency towards the substrate 100.

In a top emission type device where an image is realized towards the second electrode 200c, the thickness of the second electrode 200c may be relatively thin such that the second electrode 200c is semi-transmissive reflective film. Alternatively, the second electrode 200c may be formed of a transparent conductive material. In some exemplary embodiments, the first electrode 200a may further include a reflective film.

Then, the organic film 210 may be formed on the second electrode 200c. The organic film 210 may operate as a protection layer for preventing the second electrode 200c from being damaged while forming a first inorganic film 310 of FIG. 6 on the organic light emitting unit 200 via thin film encapsulation.

When the organic light emitting unit 200 is a top emission type where light is emitted towards the second electrode 200c, the organic film 210 is formed of a material that is transparent and has a high refractive index so as to perform refractive index matching. For example, the organic film 210 may be formed of at least one of LiF, Liq, and Al$q_3$. The organic film 210 may be also formed on the substrate 100, as well as a top surface of the organic light emitting unit 200. The organic film 210 may be a uniform film so as to seal the entire organic light emitting unit 200.

Figure 6:
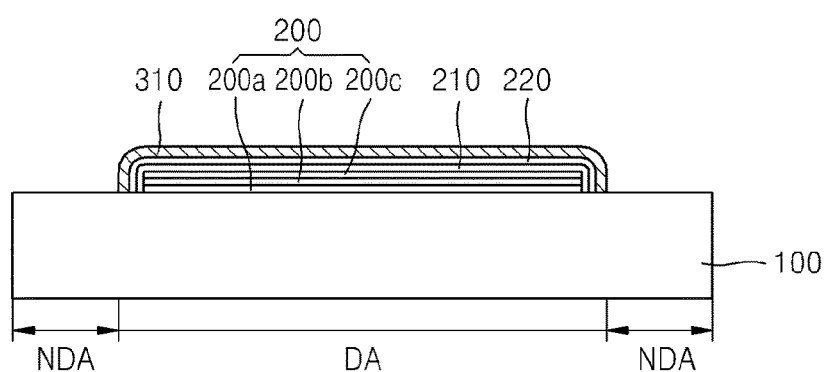

The organic film 210 may be formed of a resistance heating deposition method, a sputtering method, a vacuum deposition method, a low temperature deposition method, an electron beam coating method, or an ion plating method. Here, the resistance heating deposition method is performed by depositing a source on a deposition target by heating and evaporating the source according to electric resistance. For example, the sputtering method may be performed by manufacturing a thin film via sputtering. Then, as shown in FIG. 6, the first inorganic film 310 may be formed on the organic light emitting unit 200 covered by the organic film 210.

Also, in order to promote adhesion between the organic film 210 and the first inorganic film 310, the adhesion promoting film 220 may be further disposed between the first inorganic film 310 and the organic film 210.

The adhesion promoting film 220 promotes adhesion of the organic film 210 and the first inorganic film 310. For example, since the organic film 210 includes an organic material, the adhesion of the organic film 210 and the first inorganic film 310 is organic-inorganic adhesion, and thus the adhesion may be weak compared to inorganic-inorganic adhesion.

Accordingly, for example, the adhesion promoting film 220 may be disposed between the organic film 210 and the first inorganic film 310 so as to strengthen the adhesion between the organic film 210 and the first inorganic film 310 and provide a rigid thin film encapsulation structure. The adhesion promoting film 220 may include at least one of a metal oxide and an organometallic compound.

The metal oxide may be $Al_2O_3$, $SiO_2$, $Si_xN_y$, or zinc tin oxide (a compound obtained by removing conductivity by increasing a ratio of tin and oxide). Also, the organometallic compound may be a mononuclear metal carbonyl compound $(M(CO)_x)$ or polynuclear metal carbonyl compound $(M_x(CO)_y)$, wherein $M(CO)_x$ may be $Mo(CO)_5$, $Fe(CO)_5$, $Cr(CO)_6$, or $W(CO)_6$, and $M_x(CO)_y$ may be $Mn_2(CO)_{10}$, $Co_2(CO)_8$, or $Fe_2(CO)_9$. However, an embodiment of the present invention is not limited thereto.

The adhesion promoting film 220 may be formed of a single film or a multiple films including the above-described materials.

The adhesion promoting film 220 may be also formed on the substrate 200, as well as the top surface of the organic film 210. The adhesion promoting film 220 may be a uniform film to cover the entire organic light emitting unit 200. Accordingly, the adhesion promoting film 220 may further tightly seal the organic light emitting unit 200 and the organic film 210.

The adhesion promoting film 220 may be formed by using a resistance heating deposition method, a sputtering method, a vacuum deposition method, a low temperature deposition method, an electron beam coating method, or an ion plating method.

Then, the first inorganic film 310 may be formed on the organic film 210. The first inorganic film 310 may include a first LVT inorganic material. An operation of forming the first inorganic film 310 will now be described in detail.

First, a first pre-inorganic film (not shown) including the first LVT inorganic material may be formed by providing the first LVT inorganic material on the adhesion promoting film 220.

The first LVT inorganic material may be an inorganic material having a low first viscosity transition temperature.

Herein, the term "viscosity transition temperature" does not mean a temperature at which viscosity of the LVT inorganic material completely changes from "solid" to "liquid", but means a minimum temperature for providing fluidity to the LVT inorganic material.

The first viscosity transition temperature of the first LVT inorganic material may be lower than the degeneration temperature of the material included in the organic light emitting unit 200.

The degeneration temperature of a material included in an organic light emitting unit means a temperature that causes chemical and/or physical degeneration of the material included in the organic light emitting unit. For example, the degeneration temperature may mean a glass transition temperature (Tg) of an organic material included in the intermediate layer 200b of the organic light emitting unit 200. The glass transition temperature may be derived based on a result of performing thermal analysis (e.g., an $N_2$ atmosphere, a temperature range: room temperature to 600° C. (10° C./min)—TGA, room temperature to 400° C.—DSC, and pan type: Pt pan in disposal Al pan (TGA), disposal Al pan (DSC)) using thermo gravimetric analysis (TGA) and differential scanning calorimetry (DSC) on the material included in the organic light emitting unit 200.

The degeneration temperature of the material included in the organic light emitting unit 200 may exceed, for example, 130° C., but is not limited thereto, and may be easily measured via TGA described above with respect to the material included in the organic light emitting unit 200.

The first viscosity transition temperature of the first LVT inorganic material may be equal to or higher than 200° C., but is not limited thereto.

The first LVT inorganic material may include tin oxide (SnO) and at least one of phosphorous oxide ($P_2O_5$), boron phosphate ($BPO_4$), tin fluoride ($SnF_2$), niobium oxide (NbO or $Nb_2O_5$), lead fluoride ($PbF_2$), silicon oxide ($SiO_2$), tungsten oxide ($WO_3$), indium oxide ($In_2O_3$), bismuth oxide ($Bi_2O_3$), zinc oxide (ZnO), and boron oxide ($B_2O_3$).

For example, the first LVT inorganic material may include:

SnO and $P_2O_5$;
SnO, $P_2O_5$, and $B_2O_3$;
SnO, $P_2O_5$, and $SnF_2$; or
SnO, $P_2O_5$, $B_2O_3$, and $SnF_2$, but is not limited thereto.

For example, the first LVT inorganic material may have a following composition, but a material and a composition of the first LVT inorganic material are not limited as long as the first LVT inorganic material has the first viscosity transition temperature equal to or higher than 200° C.

1) SnO (60 to 80 mol %) and $P_2O_5$ (20 to 40 mol %);

2) SnO (60 to 80 mol %), $P_2O_5$ (10 to 20 mol %), and $B_2O_3$ (10 to 20 mol %) (here, the sum of SnO, $P_2O_5$, and $B_2O_3$ is 100 mol %);

3) SnO (40 to 60 mol %), $P_2O_5$ (20 to 40 mol %), and $SnF_2$ (1 to 19 mol %) (here, the sum of SnO, $P_2O_5$, and $SnF_2$ is 100 mol %); or 4) SnO (40 to 60 mol %), $P_2O_5$ (10 to 20 mol %), $B_2O_3$ (10 to 20 mol %), and $SnF_2$ (1 to 19 mol %) (here, the sum of SnO, $P_2O_5$, $B_2O_3$, and $SnF_2$ is 100 mol %).

In some examples, the first pre-inorganic film may be formed by performing a resistance heating deposition method, a sputtering method, a vacuum deposition method, a low temperature deposition method, an electron beam coating method, or an ion plating method.

For example, the first LVT inorganic material may be provided by using a plasma chemical vapor deposition (PCVD) method or a plasma-ion assisted deposition (PIAD) method, but is not limited thereto.

According to exemplary embodiments, the first LVT inorganic material having a SnO—$P_2O_5$—$B_2O_3$ composition may be provided on the adhesion promoting film 220 via a sputtering method. The sputtering method may be performed by applying a dual rotary target method or a facing target method using direct current (DC) pulse power, and performing scanning while moving the substrate 100. Here, argon plasma of about 4 kW to about 20 kW and about 0.3 Pa to about 1.5 Pa may be used, and a desired thickness (for example, about 1 μm) of the first pre-inorganic film may be obtained via a plurality of scans.

The first pre-inorganic film formed as such may include a defect, such as a film formation element or a pin hole. The film formation element of the first LVT inorganic material means aggregated particles of the first LVT inorganic material that do not contribute to film formation while forming the first LVT inorganic material, and the pin hole is an area where the organic film 210 is exposed since the first LVT inorganic material is not provided.

As described above, the defect of the first pre-inorganic film may operate as a moving passage of an external environmental material, such as moisture or oxygen, while storing and operating an organic light emitting apparatus, thereby causing a progressive dark spot. Accordingly, a life of the organic light emitting apparatus may be decreased.

Accordingly, a first heating operation may be performed to remove the defect of the first pre-inorganic film after forming the first pre-inorganic film.

The first heating operation may be performed at a temperature equal to or higher than the first viscosity transition temperature of the first LVT inorganic material. For example, the first heating operation may be performed by thermally treating the first pre-inorganic film at a temperature equal to or higher than the first viscosity transition temperature of the first LVT inorganic material and lower than the degeneration temperature of the material included in the organic light emitting unit 200.

In order to prevent the organic light emitting unit 200 from being exposed to an external environment through the pin hole of the first pre-inorganic film, the first heating operation may be performed in an IR oven under a vacuum or inert gas ($N_2$ or Ar) atmosphere.

In the first heating operation, the first LVT inorganic material included in the first pre-inorganic film may be fluidized. The fluidized first LVT inorganic material may have flowability. Accordingly, during the first heating operation, the fluidized first LVT inorganic material may flow and filled in the pin hole of the first pre-inorganic film, and the film formation element may be fluidized and filled in the pin hole.

As a result, the defect of the first pre-inorganic film may be removed, and the first inorganic film 310 having a dense film quality may be formed.

The thickness of the first inorganic film 310 may be from about 1 μm to about 30 μm, for example, from about 1 μm to about 5 μm. Here, when the thickness of the first inorganic film 310 is within a range from about 1 μm to about 5 μm, a flexible organic light emitting apparatus having a bending characteristic may be realized.

Figure 7:
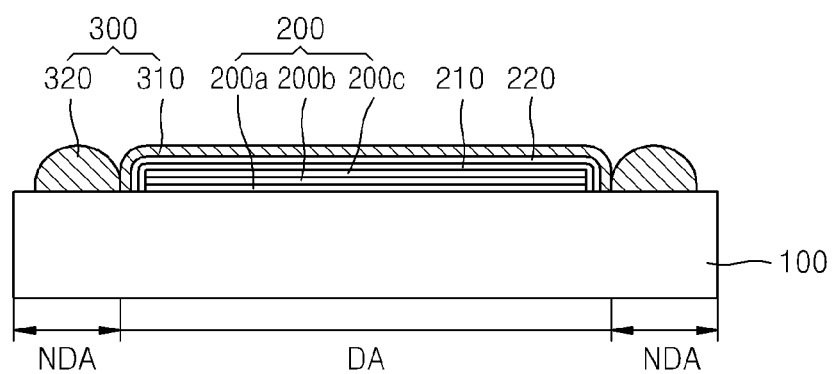

Then, referring to FIG. 7, for example, the second inorganic film 320 may be formed on the non-display region (NDA) of the substrate 100. The second inorganic film 320 may include a second LVT inorganic material having a second viscosity transition temperature lower than the first viscosity transition temperature of the first inorganic film 310. An operation of forming the second inorganic film 320 will now be described in detail.

First, the second LVT inorganic material is provided on the non-display region NDA of the substrate 100 to form a second pre-inorganic film (not shown) including the second LVT inorganic material.

For example, the second viscosity transition temperature of the second LVT inorganic material may be lower than 120° C. For example, the second viscosity transition temperature may be equal to or higher than 80° C., for example, from about 80° C. to about 120° C., but is not limited thereto.

The second LVT inorganic material may be one type of compound or a mixture of two or more types of compounds.

The second LVT inorganic material may include tin oxide, such as SnO or $SnO_2$.

When the second LVT inorganic material includes SnO, an amount of SnO may be from about 20 wt % to about 100 wt %.

For example, the second LVT inorganic material may include, as well as tin oxide, at least one of phosphorous oxide ($P_2O_5$), boron phosphate ($BPO_4$), tin fluoride ($SnF_2$), niobium oxide (NbO or $Nb_2O_5$), lead fluoride ($PbF_2$), silicon oxide (SiO$_2$), tungsten oxide (WO$_3$), indium oxide (In$_2$O$_3$), bismuth oxide (Bi$_2$O$_3$), zinc oxide (ZnO), and boron oxide (B$_2$O$_3$).

For example, the second LVT inorganic material may include:
SnO;
SnO and BPO$_4$;
SnO, SnF$_2$, and P$_2$O$_5$;
SnO, SnF$_2$, P$_2$O$_5$, and NbO; or
SnO, SnF$_2$, P$_2$O$_5$, and WO$_3$, but is not limited thereto.

For example, the second LVT inorganic material may have a following composition, but a material and a composition of the second LVT inorganic material are not limited as long as the second LVT inorganic material has the second viscosity transition temperature lower than 120° C.

1) SnO (100 mol %);
2) SnO (90 mol %) and BPO$_4$ (10 mol %);
3) SnO (32.5 to 42.5 mol %), SnF$_2$ (35 to 50 mol %), and P$_2$O$_5$ (15 to 20 mol %) (here, the sum of SnO, SnF$_2$, and P$_2$O$_5$ is 100 mol %);
4) SnO (20 to 50 mol %), SnF$_2$ (30 to 60 mol %), P$_2$O$_5$ (10 to 30 mol %), and NbO (1 to 5 mol %) (here, the sum of SnO, SnF$_2$, P$_2$O$_5$, and NbO is 100 mol %); or
5) SnO (20 to 50 mol %), SnF$_2$ (30 to 60 mol %), P$_2$O$_5$ (10 to 30 mol %), and WO$_3$ (1 to 5 mol %) (here, the sum of SnO, SnF$_2$, P$_2$O$_5$, and WO$_3$ is 100 mol %).

For example, the second pre-inorganic film may be formed by using a resistance heating deposition method, a sputtering method, a vacuum deposition method, a low temperature deposition method, an electron beam coating method, or an ion plating method.

According to exemplary embodiments, the second LVT inorganic material having a SnO—SnF$_2$—P$_2$O$_5$ composition may be provided on the non-display region NDA of the substrate 100 via a sputtering method.

Since the second pre-inorganic film formed as such may include a defect, such as a film formation element or a pin hole, a second heating operation is performed to remove the detect of the second pre-inorganic film.

The second heating operation may be performed by thermally treating the second pre-inorganic film formed on the non-display region (NDA) for 1 to 3 hours at a temperature from 120° C. to 150° C. (for example, for 2 hours at 130° C.), but is not limited thereto. When the temperature of the second heating operation is within a range described above, the second LVT inorganic material of the second pre-inorganic film may be fluidized, and thus an edge defect of the organic light emitting apparatus may be prevented.

By performing the second heating operation, the second LVT inorganic material included in the second pre-inorganic film may be fluidized. The fluidized second LVT inorganic material may have flowability. Accordingly, during the second heating operation, the fluidized second LVT inorganic material may flow and filled in a pin hole of the second pre-inorganic u) film, and the film formation element may be fluidized and filed in the pin hole.

As a result, a defect of the second pre-inorganic film may be removed, and thus the second inorganic film 320 having a dense film quality may be formed.

A thickness of the second inorganic film 320 may be from about 1 μm to about 30 μm, for example, from about 1 μm to about 5 μm. Here, when the thickness of the second inorganic film 320 is within a range from about 1 μm to about 5 μm, a flexible organic light emitting apparatus having a bending characteristic may be realized.

Since the second inorganic film 320 may be a thin film as described above, the second inorganic film 320 may contribute in realizing a flexible organic light emitting apparatus having a bending characteristic. Accordingly, an organic light emitting apparatus having a long life and a flexible characteristic may be realized.

According to exemplary embodiments of the present invention, a sealing characteristic of a thin film encapsulation structure may be improved by forming the first inorganic film 310 and the second inorganic film 320 having different viscosity transition temperatures respectively on the display region (DA) and the non-display region (NDA). Accordingly, a defect, such as a dark spot, generated near an edge of the organic light emitting display apparatus 1 may be prevented.

Figure 8:
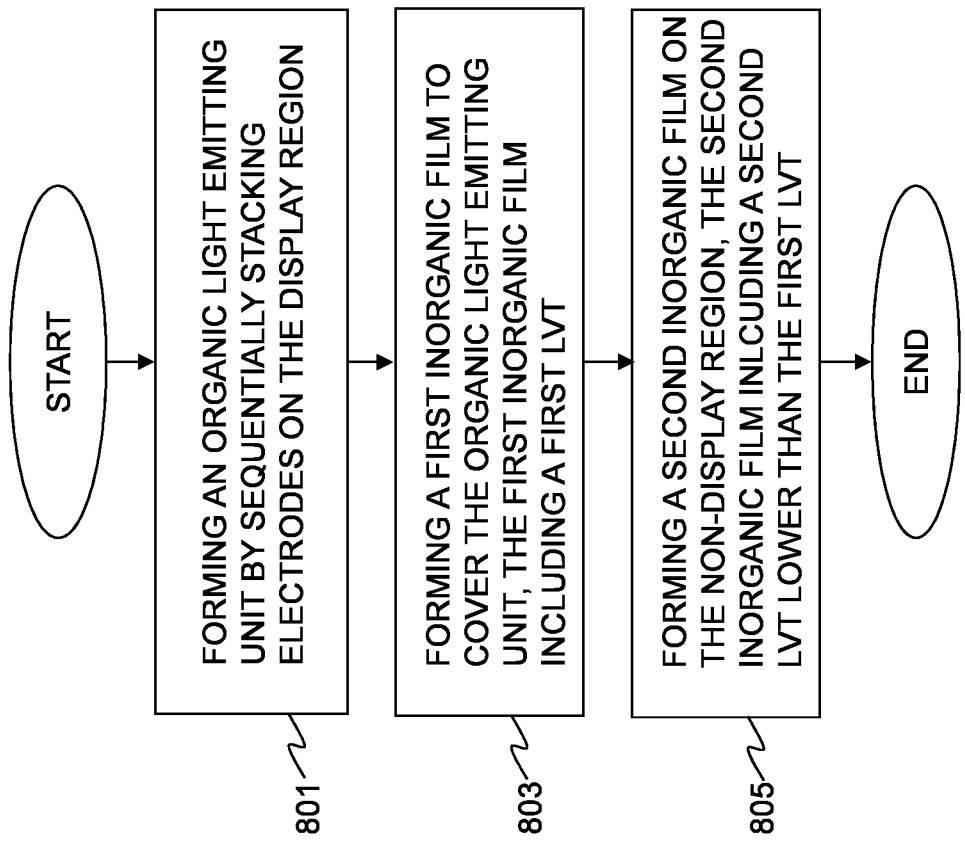
FIG. 8 is a flowchart of a process for manufacturing an organic light emitting display apparatus according to exemplary embodiments of the present invention.

FIG. 8 is a flowchart of a process for manufacturing an organic light emitting display apparatus according to exemplary embodiments of the present invention. In step 801, an organic light emitting unit is formed by sequentially stacking a first electrode, an intermediate layer, and a second electrode on a display region of a substrate, which includes the display region for displaying an image and a non-display region outside the display region. In step 803, a first inorganic film is formed to cover the organic light emitting unit. The first inorganic film includes a first low temperature viscosity transition (LVT) inorganic material having a first viscosity transition temperature. In step 805, a second inorganic film is formed on the non-display region. The second inorganic film includes a second LVT inorganic material. The second LVT inorganic material has a second viscosity transition temperature lower than the first viscosity transition temperature.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. An organic light emitting display, comprising:
a substrate comprising a display region and a non-display region outside the display region;
an organic light emitting unit disposed in the display region, the organic light emitting unit comprising a first electrode, an intermediate layer, and a second electrode sequentially stacked on the substrate; and
an encapsulation unit comprising:
an organic film disposed on the organic light emitting unit;
a first inorganic film disposed on the display region and covering the organic film, the first inorganic film comprising a first low temperature viscosity transition (LVT) inorganic material having a first viscosity transition temperature; and
a second inorganic film disposed in direct contact with the non-display region and adjacent to the first inorganic film without directly contacting any portion of the organic film, the second inorganic film comprising a second LVT inorganic material having a second viscosity transition temperature lower than the first viscosity transition temperature.

2. The organic light emitting display apparatus of claim 1, wherein the first viscosity transition temperature is equal to or higher than at least 200° C., and the second viscosity transition temperature is in a range of 80° C. to 120° C.

3. The organic light emitting display apparatus of claim 1, wherein the first LVT inorganic material comprises 60 to 80 mol % of SnO and 20 to 40 mol % of P$_2$O$_5$.

4. The organic light emitting display apparatus of claim 1, wherein the second LVT inorganic material comprises 32.5 to 42.5 mol % of SnO, 35 to 50 mol % of $SnF_2$, and 20 to 40 mol % of $P_2O_5$, wherein the sum of the SnO mol %, $P_2O_5$ mol %, and $SnF_2$ mol % is 100 mol %.

5. The organic light emitting display apparatus of claim 1, wherein the substrate is a flexible substrate.

6. The organic light emitting display apparatus of claim 1, further comprising:
   an adhesion promoting film disposed on the organic film.

7. The organic light emitting display apparatus of claim 1, wherein the organic film is further disposed on the substrate.

8. The organic light emitting display apparatus of claim 6, wherein the adhesion promoting film comprises at least one of a metal oxide and an organometallic compound.

9. The organic light emitting display apparatus of claim 6, wherein the adhesion promoting film and the first inorganic film are disposed on the substrate.

* * * * *